(12) United States Patent
Arias et al.

(10) Patent No.: US 11,862,576 B2
(45) Date of Patent: Jan. 2, 2024

(54) IC HAVING ELECTRICALLY ISOLATED WARPAGE PREVENTION STRUCTURES

(71) Applicant: Texas Instruments Incorporated, Dallas, TX (US)

(72) Inventors: Christlyn Faith Hobrero Arias, Taguig (PH); Rafael Jose Lizares Guevara, Makati (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 121 days.

(21) Appl. No.: 17/512,958

(22) Filed: Oct. 28, 2021

(65) Prior Publication Data

US 2023/0139898 A1 May 4, 2023

(51) Int. Cl.
*H01L 23/00* (2006.01)
*H01L 23/31* (2006.01)
*H01L 21/71* (2006.01)

(52) U.S. Cl.
CPC ........... *H01L 23/562* (2013.01); *H01L 21/71* (2013.01); *H01L 23/3114* (2013.01); *H01L 24/05* (2013.01); *H01L 2224/02379* (2013.01)

(58) Field of Classification Search
CPC ... H01L 23/562; H01L 21/71; H01L 23/3114; H01L 24/05; H01L 2224/02379; H01L 24/03
See application file for complete search history.

(56) References Cited

U.S. PATENT DOCUMENTS

| | | | |
|---|---|---|---|
| 2012/0104604 A1* | 5/2012 | McCarthy | H01L 23/3114 257/738 |
| 2017/0263523 A1* | 9/2017 | Ji | H01L 24/08 |
| 2020/0126940 A1* | 4/2020 | Yu | H01L 25/0655 |
| 2021/0091022 A1 | 3/2021 | Chen et al. | |
| 2021/0210462 A1* | 7/2021 | Sridharan | H01L 24/81 |

* cited by examiner

*Primary Examiner* — Thanh T Nguyen
(74) *Attorney, Agent, or Firm* — Ronald O. Neerings; Frank D. Cimino

(57) ABSTRACT

Disclosed aspects include a semiconductor die including a substrate having a semiconductor surface including circuitry. A top metal layer is above the semiconductor surface including top metal lines that are electrically connected through a metal stack including metal interconnects that electrically connect to the circuitry. The top metal lines are configured in a primary orientation that collectively represents at least 50% of a total length of the top metal lines in a first direction. The top metal layer includes bond pads exposed from a passivation layer. The metal features are positioned lateral to and not directly electrically connected to the top metal layer and/or are positioned on the passivation layer. At least a majority of a total area of the metal features is not over metal interconnects. The metal features have a length direction oriented in a second direction that is at least essentially perpendicular relative to the primary orientation.

20 Claims, 9 Drawing Sheets

IC HAVING ELECTRICALLY ISOLATED WARPAGE PREVENTION STRUCTURES

FIELD

This Disclosure relates to semiconductor wafer level warpage control for semiconductor die that include a top metal layer, such as including at least one redistribution layer (RDL) as the top metal layer.

BACKGROUND

Wafer level packaging (WLP) implemented as a wafer chip scale package (WCSP) device has become commonplace for smartphones, tablets and laptop computers due to the small, lightweight, and fast performance provided by a WCSP device which allows these semiconductor packages to be provided in handheld sizes with high-quality graphics, instead of large bulky devices. A WCSP uses at least one RDL coupled to bond pads on a top side of the semiconductor die. Processes including RDL formation are performed at the wafer level in the wafer fabrication facility instead of later in assembly processing generally using wire bonding for the electrical connections to solder balls over the bond pads. The solder balls are electrically connected to the RDL that connects to bond pads on the semiconductor die.

There are three primary uses for an RDL. The first is to move the bond pads around the semiconductor die for flip-chip applications. It may be important to spread the contact points around the die so that solder balls can be applied and the stress of mounting the solder balls can be spread out. Another application of RDL comprises die stacking. In this die stacking application, similar die can be mounted in a single package using a stacked configuration. In order to provide each semiconductor die a unique address, the address lines on each die can be placed in a unique location. A third application for RDL is to move the bond pads of a device to a position more convenient or accessible for subsequent bonding and packaging steps. This may include matching the layout of an older semiconductor die that is no longer being supported and needs to be replaced by a newer semiconductor die design.

The RDL generally includes at least one associated dielectric layer that typically comprises a polyimide (PI) material. A PI layer is generally provided both above and below the RDL for protecting the RDL. A solder bump (or solder ball) is generally positioned on an under bump metallization (UBM) layer that contacts a bond pad area of the RDL from above through an aperture in the upper PI layer. The RDL includes a trace that contacts the bond pad area which is electrically connected to a bond pad on the semiconductor die including an aperture through a passivation layer.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize during the back-end processing of semiconductor wafers, wafer warpage is known is recognized to occur due to the mismatch in the coefficient of thermal expansion (CTE) of the various layer materials. High levels of wafer warpage is one of the root causes leading to process and product failures and/or yield loss.

Disclosed aspects also recognize wafer-level warpage due to the solder bumping process is observed to increase significantly after assembly thermal processing, such as in one example for WCSP die when they include at least one RDL and at least one dielectric layer that as described above is generally a PI layer. The significant thermal processing comprises a post-develop bake (PDB), PI cure, and solder ball reflow. The highest temperature reached during assembly is generally the solder ball reflow process which can be performed in a temperature range of 250° C. to 275° C. depending on the particular bump technology utilized.

The mismatch of CTE can be significant, such as in the case of a WCSP die between the substrate material that is typically silicon, and the RDL(s) which generally comprises Cu, and the dielectric layer that is typically above and below the RDL which generally comprises PI. An increasing trend for higher RDL density will result in increased wafer-level warpage that can lead to yield reducing mechanical and process issues at assembly and at wafer probe as well, such as due to wafer handling mismatch by mechanical arms, inadequate adsorption of a vacuum suction cup, and other wafer handling issues.

To address this above-described wafer level warpage problem, disclosed aspects add metal features for warpage prevention (referred to herein as "metal features") to the semiconductor die. The metal features when formed on the semiconductor die are either formed from the top metal layer and/or are positioned on a dielectric layer that is over the top metal layer. Disclosed metal features are electrically isolated from a direct electrical connection to the top metal layer (RDL in the case of a WCSP die) and are also positioned on the semiconductor die in locations that are generally not over any metal interconnect that is electrically connected by a path including vias through the various dielectric layers to the circuitry on the semiconductor die. As used herein, electrically isolated for disclosed metal features means not being directly electrically connected to anything, and also at least a majority of the total area of the metal features are not over any metal interconnect.

Disclosed aspects include a semiconductor die comprising a substrate having a semiconductor surface including circuitry. A top metal layer is above the semiconductor surface including top metal lines that are electrically connected through a metal stack including metal interconnects electrically connected to the circuitry. The top metal lines are configured in a primary orientation that collectively represents at least 50% of a total length of all of the top metal lines in a first direction. The top metal layer includes bond pads exposed from a passivation layer that can be over or alongside (for metal damascene). The metal features are positioned lateral to and not directly electrically connected to the top metal layer and/or are positioned on the passivation layer. At least a majority of a total area of the metal features is not over metal interconnects. The metal features have a length direction oriented in a second direction that is at least essentially perpendicular (being in an angular range of 90° plus or minus 5°) relative to the primary orientation.

BRIEF DESCRIPTION OF THE DRAWINGS

Reference will now be made to the accompanying drawings, which are not necessarily drawn to scale, wherein:

FIG. 3A shows the results after photoresist coating provide a photoresist layer on a wafer comprising a plurality of semiconductor die comprising a substrate having circuitry and a metal stack thereon that does not include the semiconductor die's top metal layer formed later in the process as described below. FIG. 3B shows the results after an exposure step for exposing the photoresist layer for providing first photoresist regions for the top metal layer which will be connected to the circuitry and second photoresist regions for the metal features positioned lateral to the top metal layer portions that will be connected to the circuitry. FIG. 3C shows results after a develop step that patterns the photoresist layer to provide first regions and second regions that have a length direction that is essentially perpendicular to the primary orientation of the top metal layer described relative to FIG. 3D. FIG. 3D shows results after plating a metal to form a top metal layer, such as copper, in the first regions that are electrically connected to the circuitry and in the second regions that are disclosed metal features. FIG. 3E shows results after stripping the photoresist.

FIG. 4A shows the results after photoresist coating form a photoresist layer on the substrate including circuitry and a metal stack thereon not yet including its top metal layer. FIG. 4B shows the results after an exposure step for exposing the photoresist layer provide photoresist regions for the top metal layer which will be connected by the metal stack to the circuitry. FIG. 4C shows results after a develop step to provide patterned photoresist including open regions. FIG. 4D shows results after plating a metal to form a top metal layer in the open regions, shown as top metal region.

FIG. 4E after shows the results after coating a photoresist layer including over the dielectric layer. FIG. 4F shows results after exposing the photoresist layer to form exposed regions. FIG. 4G shows results after developing off the exposed region to provide open regions. FIG. 4H shows results after plating form the metal features in the open regions. FIG. 4I shows the results after stripping off the photoresist.

DETAILED DESCRIPTION

Figure 1:
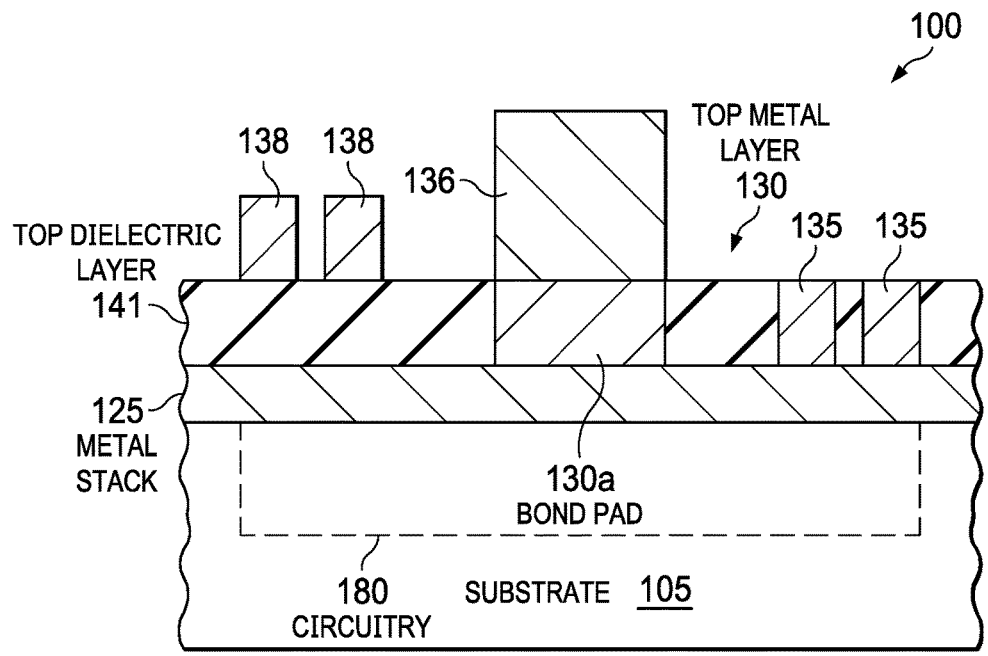
FIG. 1 is a cross-sectional view of an example semiconductor die including a substrate comprising circuitry including disclosed metal features, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

Disclosed aspects can be implemented by changing the top metal layer by adding Cu or other metal such as aluminum metal features which function to reduce wafer warpage, where the metal features comprise the top metal layer, and/or the metal features are on a dielectric layer that is on the top metal layer. The metal features are located in positions to be electrically isolated from the top metal layer, and any other metal that may be in other metal layers that is connected to circuitry on the semiconductor die being electrically isolated minimizes (or essentially eliminate) the possible effect of the metal features on the electrical performance of the semiconductor die.

The disclosed metal features are generally shaped as strips meaning being rectangular in shape, or related shapes including elliptical excluding circular or an X or another shape, as long as the length direction of the metal features are at least essentially perpendicular to the primary orientation of the top metal layer to counteract the direction of warpage. Essentially perpendicular as used herein means the metal features have their length direction oriented at an angle of 90°±5° thus being perpendicular or essentially perpendicular to the primary orientation (length direction) of the top metal layer, to thus be positioned to help prevent the warpage curvature of the wafer during assembly thermal processing, and thus the semiconductor die on the wafer.

Disclosed metal features when they utilize the top metal layer itself can be produced by modifying the reticle design for the top metal layer. In this arrangement, there is no additional processing needed to add disclosed metal features. Another disclosed option for the metal features is to form the metal features on another metal layer that is on top of a dielectric layer which is on the top metal layer, such as for a WCSP die on the upper PI layer above the top of the RDL. Metal features above the top metal layer can be implemented by adding an additional photolithography and a plating process to position the metal features after RDL deposition (plating) on the upper PI layer.

The disclosed metal features functioning as warpage prevention structures can reduce wafer-level warpage without any process modification. Moreover, the metal features are electrically isolated from the interconnect levels which means that they will not measurably affect the electrical performance of the semiconductor die. For forming WCSP die a standard PI process and a standard copper plating process can be used with only modification of the RDL design to add metal features functioning as warpage prevention structures.

As used herein, the term primary orientation is defined as a top metal orientation that collectively represents at least 50% of the total length of all of the top metal lines. It is recognized herein that most semiconductor die have top metal lines configured in a primary orientation. To implement disclosed aspects there is generally an initial evaluation of the top metal layer to determine its primary orientation, where the direction of wafer warpage which has been found to be at an angle of about 90° relative to the primary orientation, where 90° relative to the primary orientation may be considered a wafer warpage direction. By placing disclosed metal features so that they are essentially perpendicular (90°±5°) to the primary orientation, the metal features are thus parallel to the wafer warpage direction which has been found to counteract these stresses in the wafer warpage direction, thus reducing wafer warpage.

FIG. 1 is a cross-sectional view of an example semiconductor die 100 comprising a substrate 105 comprising circuitry 180 including disclosed metal features. There is a metal stack 125 on a surface of the substrate 105, and a top metal layer 130 shown damascened into a top dielectric layer 141. Alternatively, such as in the case that the top metal layer 130 comprises aluminum, although not shown, the top dielectric layer 141 can be formed on the top metal layer 130. The metal stack 125 generally represents a plurality of metal interconnect layers above semiconductor surface of the substrate 105 each including metal layer and a dielectric layer, generally having filled vias through these dielectric layers that are below the top metal layer 130. The top metal layer 130 includes a bond pad 130a. On top of the bond pad 130a there is bonding feature 136 comprising a pillar that may comprise copper. Alternatively, for the bonding feature, a UBM layer can further include a solder ball thereon.

There are metal features 135 on the same level as the top metal layer 130 positioned lateral to the top metal layer 130. There are also metal features 138 shown positioned above the top dielectric layer 141 shown positioned lateral to the top metal layer 130. Although not shown, the respective metal features 135, 138 are generally positioned over gaps (being only over the anterior level dielectric (ILD)) in the metal stack 125.

Figure 2:
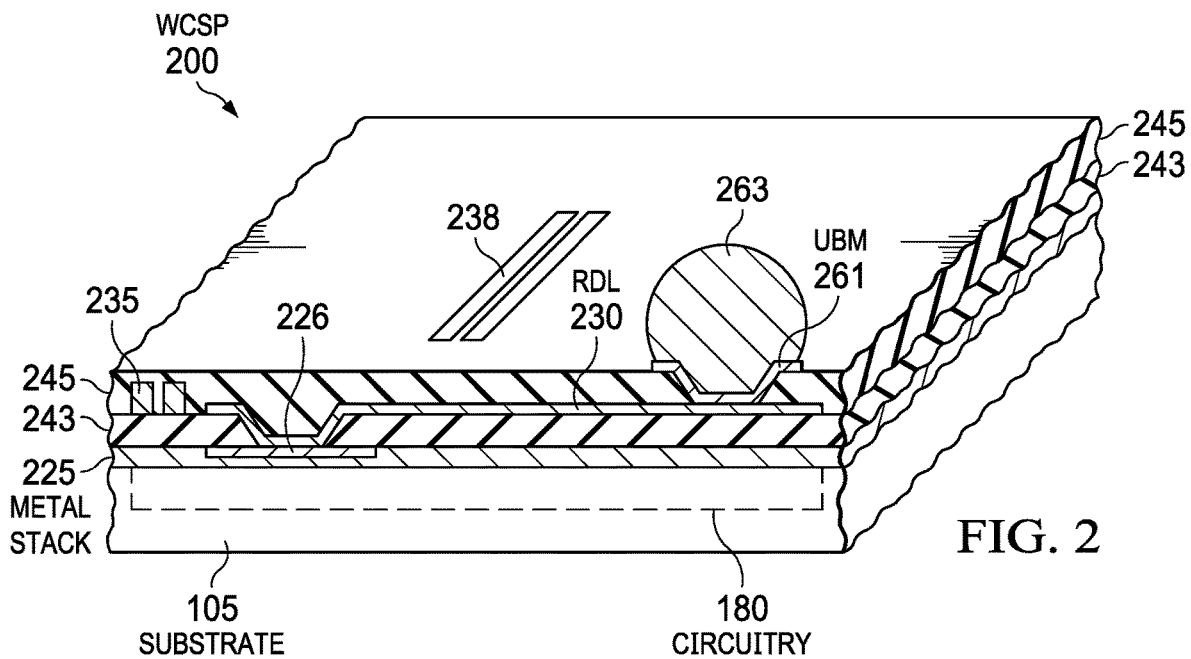
FIG. 2 is a cross-sectional view of a WCSP die comprising a substrate including circuitry, having a metal stack on a top surface of the substrate, further comprising a top-level metal layer comprising a RDL that is between a bottom dielectric layer and a top dielectric layer, according to an example aspect.

FIG. 2 is a cross-sectional view of a WCSP die 200 comprising a substrate 105 including circuitry 180, having a metal stack 225 on a top surface of the substrate 105, further comprising a top-level metal layer comprising an RDL 230 that is between a bottom dielectric layer 243 and a top dielectric layer 245, that may both comprise PI, and there are disclosed metal features 235 and 238, according to an example aspect. The metal features 238 are shown on the top dielectric layer 245 and having a rectangular shape, and the metal features 235 that are part of the RDL 230 can also have a rectangular shape. The metal features 238 generally have a minimum thickness of 6 µms. There is a die bond pad 226 formed from the metal layer at the top of the metal stack 225. The RDL 230 extends laterally to a bump area that includes a UBM layer 261 over the RDL 230 having a solder bump 263 over the UBM layer 261.

Figure 3A:
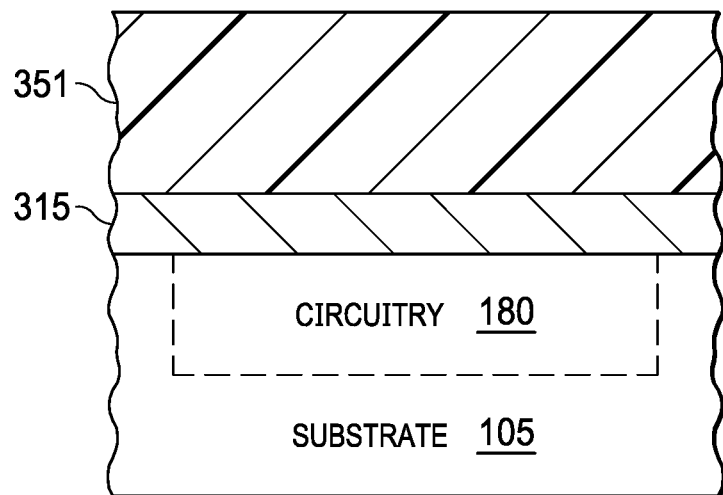
FIG. 3A-3E show successive cross-sectional view of an example in-process semiconductor die, according to an example aspect.
Figure 3B:
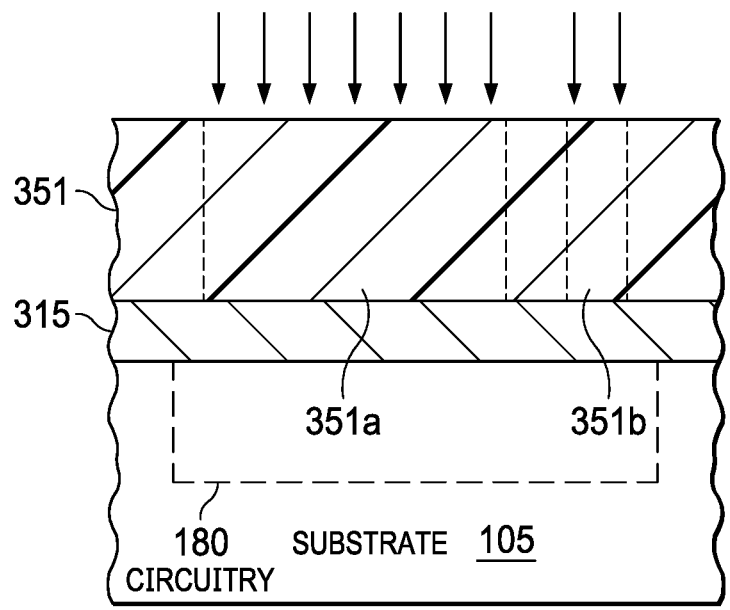

FIGS. 3A-F shows successive cross-sectional views of a top layer of an in-process semiconductor die involved in forming disclosed metal features functioning as warpage prevention structures corresponding to results following steps in an example method that comprises a one pass integration for forming the warpage prevention structures using the top metal layer. FIG. 3A shows the results after photoresist coating provide a photoresist layer 351 on a wafer comprising a plurality of semiconductor die comprising a substrate 105 having circuitry 180 and a metal stack thereon 315 that does not include the semiconductor die's top metal layer formed later in the process as described below. FIG. 3B shows the results after an exposure step for exposing the photoresist layer 351 to provide first photoresist regions 351a for the top metal layer which will be connected to the circuitry 180 and second photoresist regions 351b for the metal features positioned lateral to the top metal layer portions that will be connected to the circuitry 180. A customized reticle having a disclosed metal features may be used for the exposure step.

Figure 3C:
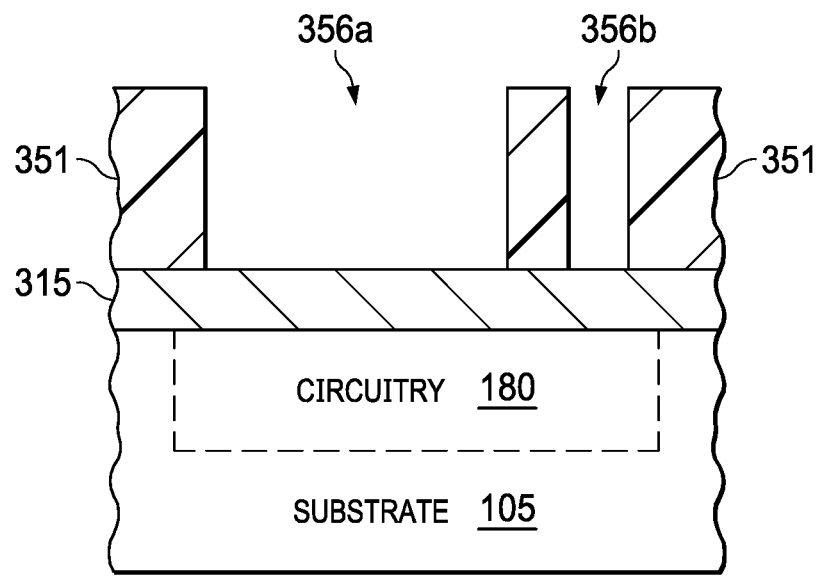
Figure 3D:
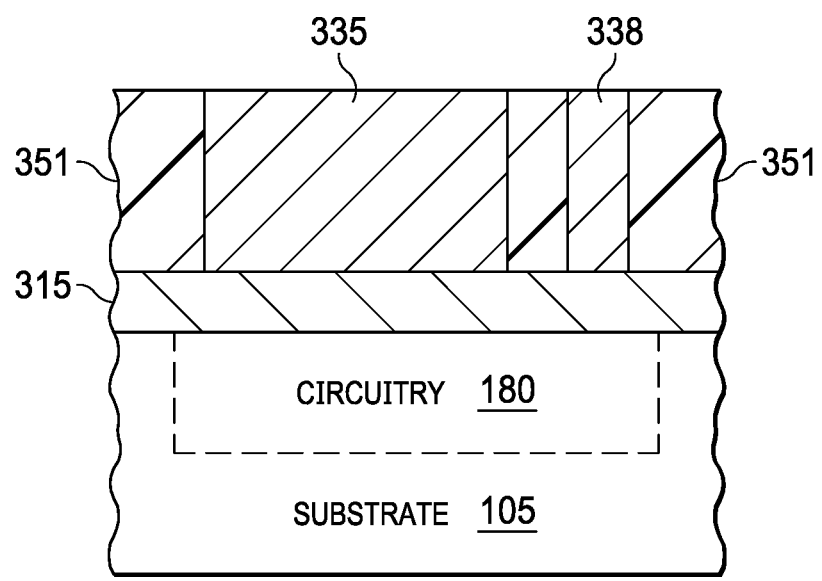
Figure 3E:
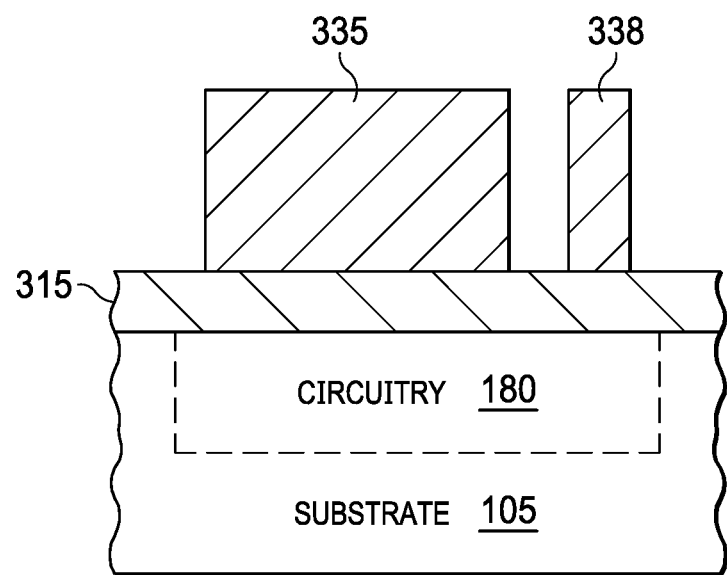

FIG. 3C shows results after a develop step that patterns the photoresist layer 351 to provide first regions 356a (generally on top of a via of the metal stack 315 that has a top dielectric layer thereover which is not shown) and second regions 356b that have a length direction that is essentially perpendicular to the primary orientation of the top metal layer described relative to FIG. 3D. FIG. 3D shows results after plating a metal to form a top metal layer, such as copper, in the first regions shown as 335 that includes an electrical connection to the circuitry 180, and in the second regions which are on the top dielectric layer where there are disclosed metal features shown as 338. The forming of a seed layer may proceed the plating step. FIG. 3E shows results after stripping the photoresist 351.

FIG. 4A-I shows successive cross-sectional views of a top layer of a wafer including a plurality of in-process ICs involved in forming disclosed metal features functioning as electrically isolated warpage prevention structures corresponding to results following steps in another example method that comprises a two-pass integration for forming a semiconductor die having warpage prevention structures positioned above the substrate surface.

Figure 4A:
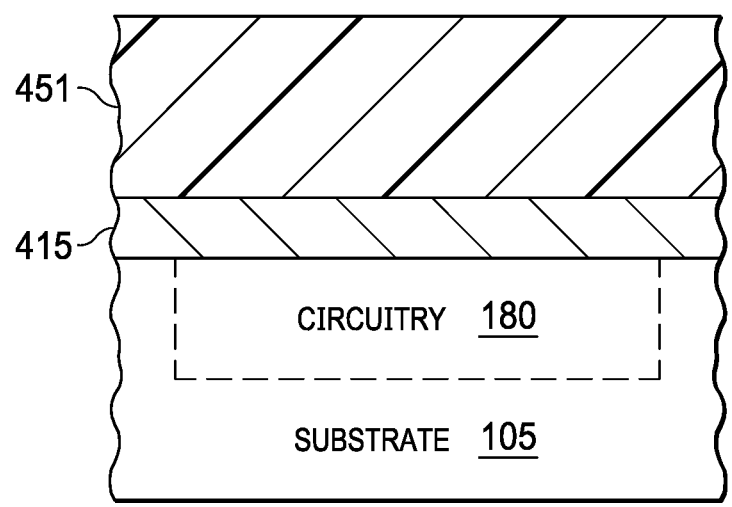
FIG. 4A-I shows successive cross-sectional views of a top layer of a wafer including a plurality of in-process semiconductor die involved in forming disclosed metal features functioning as electrically isolated warpage prevention structures corresponding to results following steps in another example method that comprises a two-pass integration for forming a semiconductor die having warpage prevention structures positioned above the substrate surface.
Figure 4B:
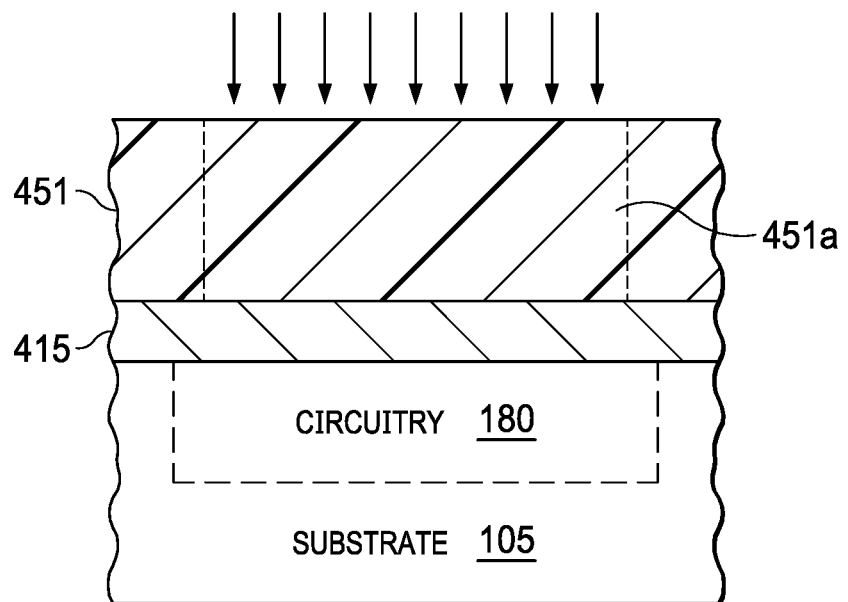
Figure 4C:
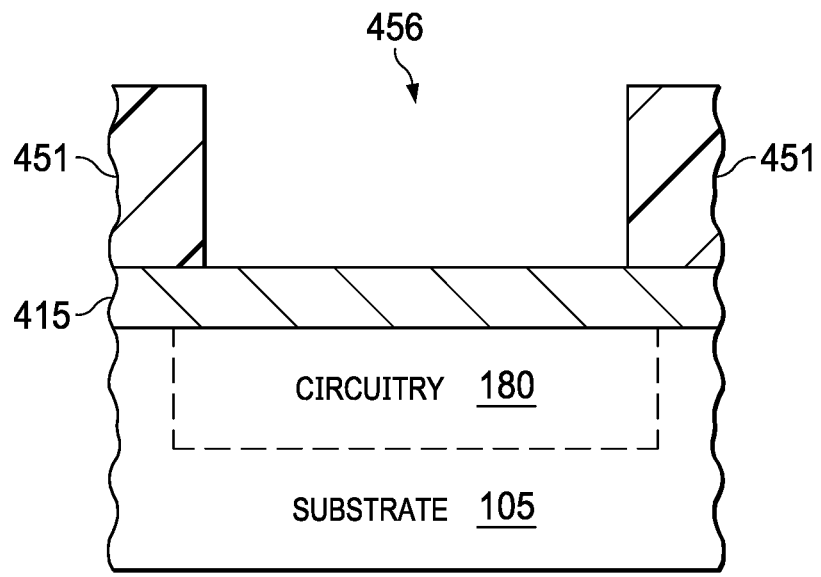
Figure 4D:
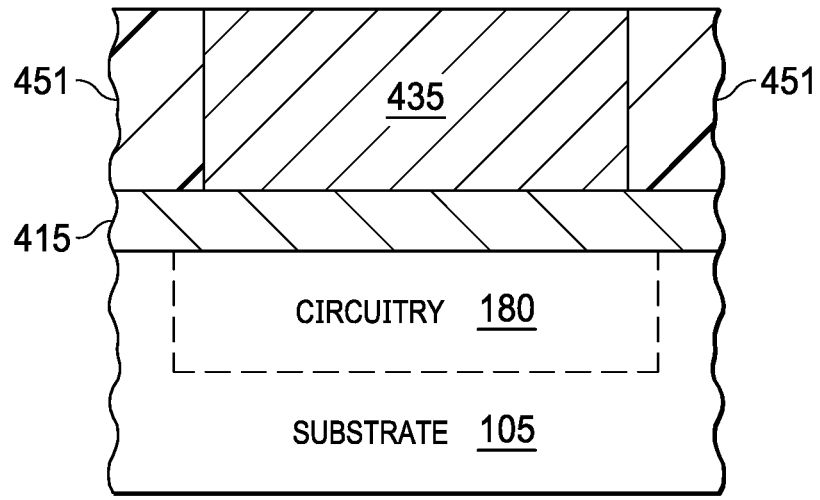

FIG. 4A shows the results after photoresist coating form a photoresist layer 451 on the substrate 105 including circuitry 180 and a metal stack thereon not yet including its top metal layer shown collectively as 415. FIG. 4B shows the results after an exposure step for exposing the photoresist layer 451 provide a photoresist regions 451a for defining the top metal layer which will be connected by the metal stack 415 to the circuitry 180. A customized reticle having a disclosed metal features may be used for the exposure step. FIG. 4C shows results after a develop step to provide patterned photoresist 451 including open regions 456. FIG. 4D shows results shows results after plating a metal to form a top metal layer, such as copper, in the open regions 456, shown as top metal region 435. As noted above a seed layer may be deposited before the plating.

Figure 4E:
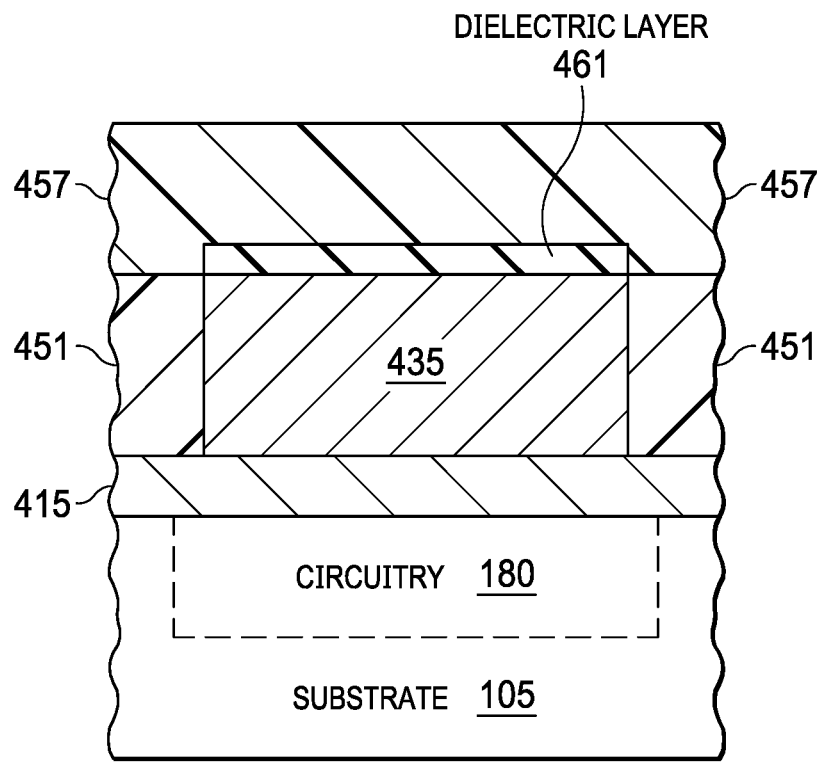
Figure 4F:
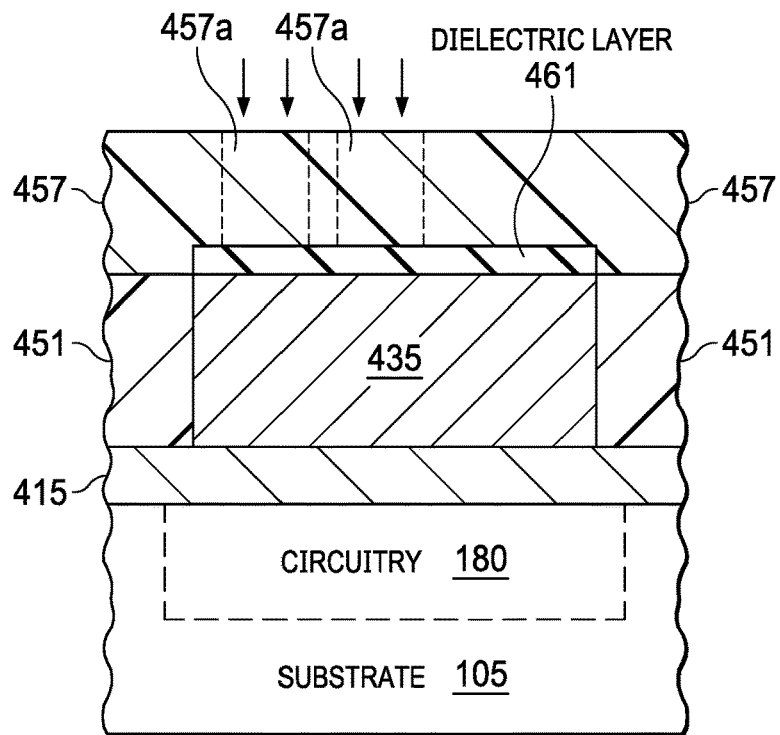
Figure 4G:
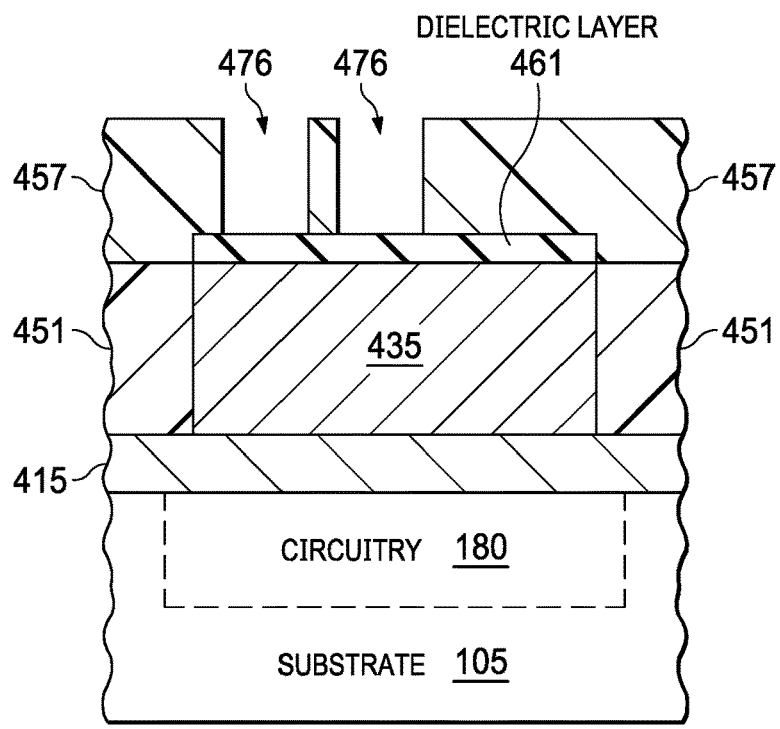
Figure 4H:
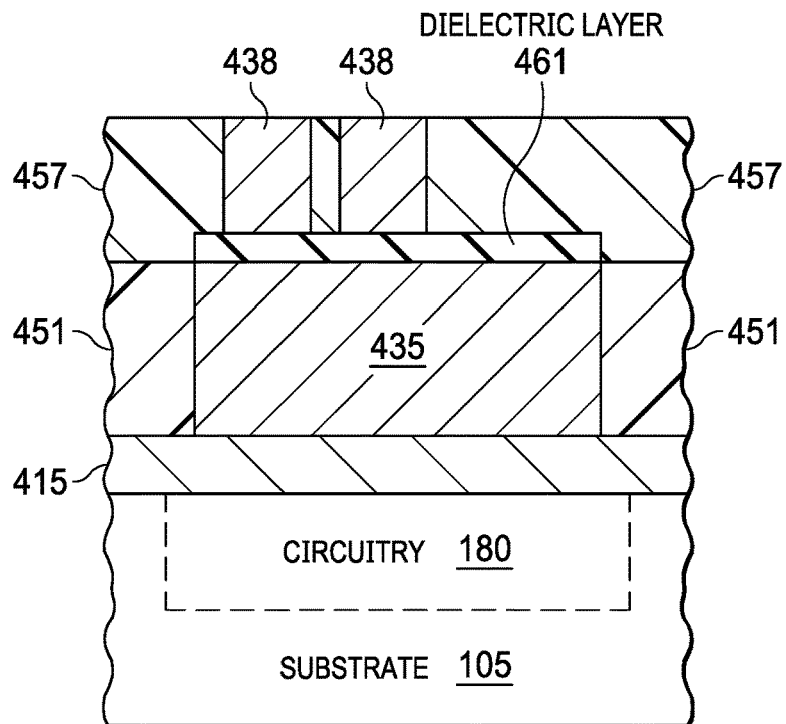
Figure 4I:
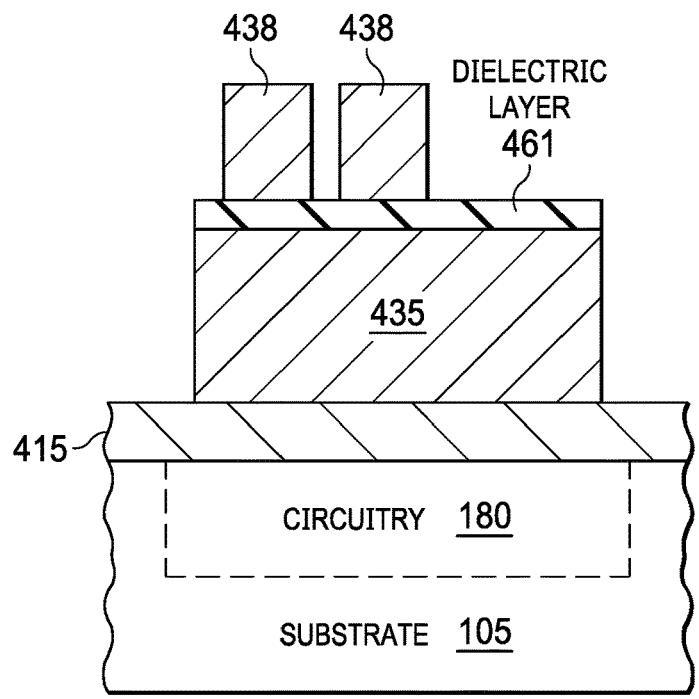

The photoresist layer 451 is then stripped off and then a dielectric layer 461 is then formed, such as being deposited, shown positioned over the top metal region 435. The dielectric layer 461 provides electric isolation between the top metal region 435 and the metal features that are formed as described below. FIG. 4E after shows the results after coating a photoresist layer 457 including over the dielectric layer 461. FIG. 4F shows results after exposing the photoresist layer 457 to form exposed regions 457a. FIG. 4G shows results after developing off of the exposed regions to provide open regions 476. The open regions 476 although due to the cross-section view are shown over the top metal region 435, where the open regions are not over the top metal regions 435. FIG. 4H shows results after plating form the metal features 438 in the open regions 476. FIG. 4I shows the results after stripping off the photoresist 457.

Figure 5A:
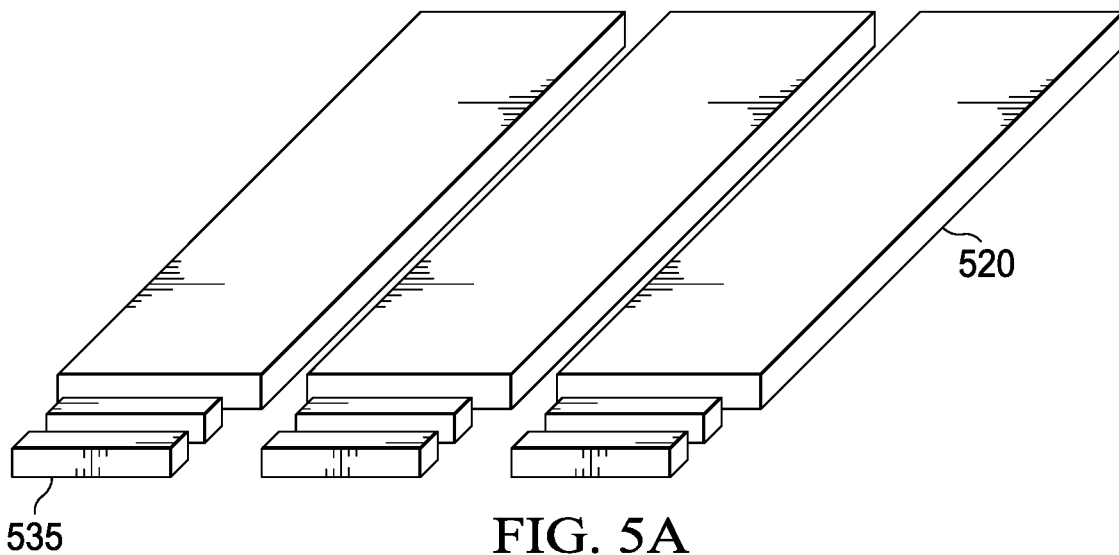
FIGS. 5A and 5B show both options for the metal features showing a top metal layer being a copper on anything (COA) layer having disclosed metal features in FIG. 5A and FIG. 5B, all having their length direction oriented 90° relative to an orientation of the lines of the COA layer shown. For metal features, the same metal level as the COA layer is used. For metal features that are on a dielectric layer, a separate metallization step is used to form the metal features.
Figure 5B:
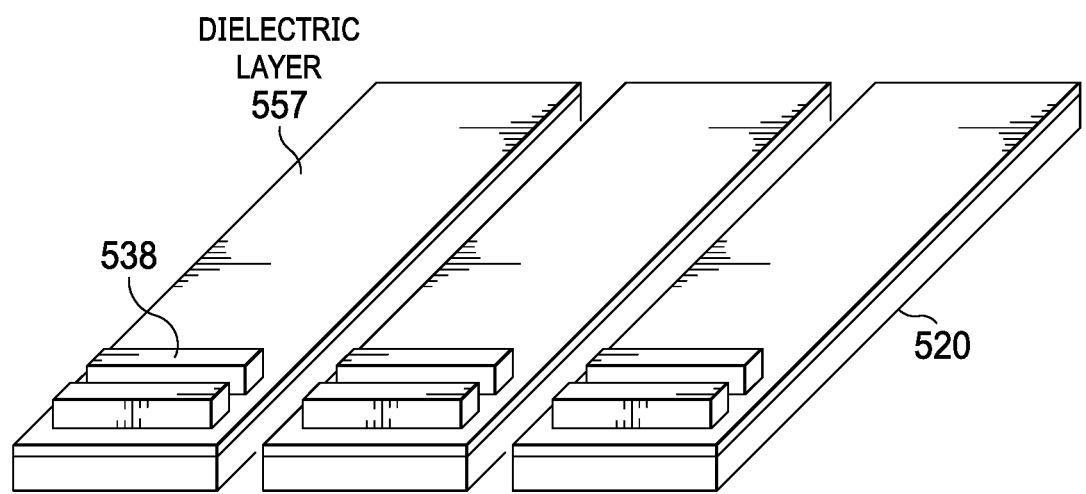

FIGS. 5A and 5B show both options for the metal features showing a top metal layer being a copper on anything (COA) layer 520 having disclosed metal features 535 in FIG. 5A and 538 in FIG. 5B, all having their length direction oriented 90° relative to an orientation of the lines of the COA layer 520 shown. For the metal features 535, the same metal level as the COA layer 520 is used. For metal features 538 that are on a dielectric layer 557, a separate metallization step, such as plating, is used to form the metal features 538.

Disclosed aspects can be integrated into a variety of assembly flows to form a variety of different semiconductor packages and related products. The semiconductor package can comprise single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions, and modifications may be made to the above-described aspects without departing from the scope of this Disclosure.

The invention claimed is:

1. A semiconductor die, comprising:
  a substrate having a semiconductor surface including circuitry,
  a top metal layer above the semiconductor surface including top metal lines that are electrically connected through a metal stack including metal interconnects electrically connected to the circuitry, the top metal lines configured in a primary orientation that collectively represents at least 50% of a total length of all of the top metal lines in a first direction, the top metal layer including bond pads exposed from a passivation layer; and
  metal features positioned in at least one of i) lateral to and not directly electrically connected to the top metal layer and ii) positioned on the passivation layer;
  wherein at least a majority of a total area of the metal features is not over metal interconnects, and
  wherein the metal features have a length direction oriented in a second direction that is at least essentially perpendicular being in an angular range of 90° plus or minus 5° relative to the primary orientation.

2. The semiconductor die of claim 1, wherein the semiconductor die comprises a wafer chip scale package (WCSP) die;
  wherein the top metal layer comprises a redistribution layer (RDL), and
  wherein the passivation layer comprises a bottom dielectric layer and a top dielectric layer having the RDL positioned in between.

3. The semiconductor die of claim 2, wherein the metal features are positioned on a same layer as the RDL.

4. The semiconductor die of claim 2, wherein the metal features are positioned on top of the top dielectric layer.

5. The semiconductor die of claim 2, wherein a first portion of the metal features are positioned on a same layer as the RDL, and wherein a second portion of the metal features are positioned on top of the top dielectric layer.

6. The semiconductor die of claim 1, wherein the total area of the metal features is not over the metal interconnects.

7. The semiconductor die of claim 1, wherein the angular range of the length direction is 90° plus or minus 2°.

8. The semiconductor die of claim 1, wherein the metal features have a rectangular shape.

9. The semiconductor die of claim 1, wherein the metal features comprise copper.

10. A wafer chip scale package (WCSP) die, comprising:
  a substrate having a semiconductor surface including circuitry,
  a redistribution layer (RDL) above the semiconductor surface including a top metal layer above the semiconductor surface comprising top metal lines that are electrically connected through a metal stack including metal interconnects electrically connected to the circuitry, the top metal lines configured in a primary orientation that collectively represents at least 50% of a total length of all of the top metal lines in a first direction, the top metal layer including bond pads exposed from a passivation layer, and
  metal features positioned in at least one of i) lateral to and not directly electrically connected to the top metal layer and ii) positioned on the passivation layer,
  wherein at least a majority of a total area of the metal features is not over the metal interconnects, and
  wherein the metal features have a length direction oriented in a second direction that is at least essentially perpendicular being in an angular range of 90° plus or minus 5° relative to the primary orientation.

11. The WCSP die of claim 10, wherein the passivation layer comprises a bottom dielectric layer and a top dielectric layer having the RDL positioned in between and wherein the metal features are positioned on a same layer as the RDL.

12. An apparatus, comprising:
  a semiconductor die comprising a substrate having a semiconductor surface including circuitry, a top metal layer above the semiconductor surface including top metal lines that are electrically connected through a metal stack including metal interconnects electrically connected to the circuitry, the top metal lines configured in a primary orientation that collectively represents at least 50% of a total length of all the top metal lines in a first direction, the top metal lines including bond pads that are exposed from a passivation layer, and
  metal features positioned in at least one of i) lateral to and are not directly electrically connected to the top metal layer and ii) positioned on the passivation layer,
  wherein at least a majority of a total area of the metal features is not over the metal interconnects, and
  wherein the metal features have a length direction oriented in a second direction that is at least essentially perpendicular being in an angular range of 90° plus or minus 5° relative to the primary orientation.

13. The apparatus of claim 12, wherein the semiconductor die comprises a wafer chip scale package (WCSP) die, wherein the top metal layer comprises a redistribution layer (RDL), and wherein the passivation layer comprises a bottom dielectric layer and a top dielectric layer having the RDL positioned in between.

14. The apparatus of claim 13, wherein the metal features are positioned on a same layer as the RDL.

15. The apparatus of claim 13, wherein a first portion of the metal features are positioned on a same layer as the RDL, and wherein a second portion of the metal features are positioned on top of the top dielectric layer.

16. The apparatus of claim 12, wherein the total area of the metal features is not over the metal interconnects.

17. The apparatus of claim 12, wherein the angular range of the length direction is 90° plus or minus 2°.

18. The apparatus of claim 12, wherein the metal features have a rectangular shape.

19. The apparatus of claim 13, wherein the metal features are positioned on top of the top dielectric layer.

20. The apparatus of claim 12, wherein the forming the metal features comprises electroplating, and wherein the metal features comprise copper.

\* \* \* \* \*